(12) United States Patent
Yavits et al.

(10) Patent No.: US 10,878,906 B2
(45) Date of Patent: Dec. 29, 2020

(54) RESISTIVE ADDRESS DECODER AND VIRTUALLY ADDRESSED MEMORY

(71) Applicant: TECHNION RESEARCH & DEVELOPMENT FOUNDATION LIMITED, Haifa (IL)

(72) Inventors: Leonid Yavits, Herzliya (IL); Ran Ginosar, Nofit (IL); Uri Weiser, Tel Aviv (IL)

(73) Assignee: TECHNION RESEARCH & DEVELOPMENT FOUNDATION LIMITED, Haifa (IL)

( * ) Notice: Subject to any disclaimer, the term of this patent is extended or adjusted under 35 U.S.C. 154(b) by 0 days.

(21) Appl. No.: 16/485,502

(22) PCT Filed: Feb. 13, 2018

(86) PCT No.: PCT/EP2018/053583
§ 371 (c)(1),
(2) Date: Aug. 13, 2019

(87) PCT Pub. No.: WO2018/146337
PCT Pub. Date: Aug. 16, 2018

(65) Prior Publication Data
US 2020/0051634 A1    Feb. 13, 2020

Related U.S. Application Data

(60) Provisional application No. 62/458,286, filed on Feb. 13, 2017.

(51) Int. Cl.
*G11C 16/04* (2006.01)
*G11C 15/04* (2006.01)
(Continued)

(52) U.S. Cl.
CPC ........ *G11C 15/046* (2013.01); *G11C 13/0023* (2013.01); *G11C 16/08* (2013.01)

(58) Field of Classification Search
CPC ......... G11C 8/08; G11C 8/10; G11C 13/0069; G11C 2213/79; G11C 11/1675;
(Continued)

(56) References Cited

U.S. PATENT DOCUMENTS

| 8,023,299 B1 | 9/2011 | Gharia |
| 2016/0203868 A1 | 7/2016 | Wang |
| 2019/0028101 A1* | 1/2019 | Nebashi ........... H03K 19/17748 |

OTHER PUBLICATIONS

International Search Report of PCT/EP2018/053583 completed Apr. 18, 2018; dated Apr. 30, 2018 2 pages.
(Continued)

*Primary Examiner* — Thong Q Le
(74) *Attorney, Agent, or Firm* — The Roy Gross Law Firm, LLC; Roy Gross (57) ABSTRACT

NAND-based content addressable memory is provided with a memory cell including two programmable resistive elements, such as memristors. These memory cells can be used to provide a programmable resistive address decoder. Such decoders can improve computer hardware performance in various ways: 1) improved translation lookaside buffers, 2) improved cache memory, and 3) by eliminating physical addresses entirely.

6 Claims, 5 Drawing Sheets

(51) Int. Cl.
*G11C 13/00* (2006.01)
*G11C 16/08* (2006.01)

(58) Field of Classification Search
CPC ............ G11C 13/0028; G11C 13/0038; G11C 2213/15; G11C 11/1693; G11C 13/00; G11C 13/003; G11C 2013/0078; G11C 13/0004; G11C 13/004; G11C 2013/0054; G11C 13/0023; G11C 15/02; G11C 15/046; G11C 16/08
USPC ..... 365/148, 158, 189.16, 100, 163, 185.23, 365/226, 230.06, 63, 189.07, 207
See application file for complete search history.

(56) References Cited

OTHER PUBLICATIONS

Witten Opinion of PCT/EP2018/053583 completed Apr. 18, 2018; dated Apr. 30, 2018 6 pages.

\* cited by examiner

RESISTIVE ADDRESS DECODER AND VIRTUALLY ADDRESSED MEMORY

CROSS-REFERENCE TO RELATED APPLICATIONS

This application is a National Phase of PCT Patent Application No. PCT/EP2018/053583 having International filing date of Feb. 13, 2018, which claims the benefit of priority of U.S. Provisional Patent Application No. 62/458,286, filed on Feb. 13, 2017. The contents of the above applications are all incorporated by reference as if fully set forth herein in their entirety.

FIELD OF THE INVENTION

This invention relates to address decoding and content addressable memory.

BACKGROUND

Memories in integrated circuits such as computers and CPUs (central processing units) employ specifically designed address decoders that enable access to the memory. The conventional architecture for this address decoding is hard coding of addresses, such that each specific part of memory has its own physical address, which cannot be changed.

One alternative to this conventional architecture is known as associative memory (also known as content-addressable memory, or CAM), where part of the content to be found in the memory is provided as an input, and the memory returns the rest of the content if the content is present in memory and an appropriate indication if the content is not present in memory.

Conventional implementations of associative memory (in particular a fully associative memory) incur larger silicon area, higher complexity, longer access delay and higher energy consumption compared to random access memory. The tradeoff is apparent in industrial products where associativity tends to increase with the decrease in the size of associative memory devices such as cache and TLB (Translation Lookaside Buffer). Accordingly, it would be an advance in the art to provide CAM having reduced complexity penalties compared to conventional CAM.

SUMMARY

In this work, hard-wired address decoders are replaced by a programmable structure, so that the address of each memory entry may be reprogrammed. The programmable structure is based on associative structure, preferably implemented as NAND CAM, preferably implemented using programmable resistive elements, such as memristors. Here a programmable resistive element is defined as a resistive element having a resistance that can be changed by applying certain threshold voltage levels to the device. If the voltage applied to the device does not reach such threshold levels, the resistance of the device remains unchanged (i.e., the device remembers its resistance).

This approach is especially useful in three applications of memories, as follows:

1) TLB. CPUs employ TLBs to perform quick address translation on every memory operation. The hit ratio of TLB is important since L2 TLB miss may result in a costly page walk. The hit ratio can be improved by increasing the associativity of the TLB.

2) Cache. CPUs employ cache to reduce the memory access time. The hit ratio of cache is critical since the last level cache miss leads to a costly DRAM access. The obvious way of improving the hit ratio is increasing the associativity of the cache.

3) Virtual addressing. Physical memory addressing is often inadequate in contemporary computer architectures since it severely limits multiprocessing and multithreading, as well as programming flexibility. The solution is virtual addressing, so that while memory itself remains physically addressable, software operates with virtual addresses which are translated into physical addresses on each memory access. However virtual to physical address translation takes its toll in terms of performance degradation and excessive energy consumption. TLBs alone may consume up to 13% of a core CPU power. Programmable address decoder enables virtual rather than physical addressing of memory.

Significant advantages are provided. The present approach allows converting memory structures from directly mapped memory, or physically mapped memory, into fully associative memory. Existing solutions incur hardware, performance and energy cost. Our solution allows reaching full associativity at no or at very little additional cost (a memory structure becomes fully associative at the base cost of a directly/physically mapped memory). Hence our solution improves performance of memory structures and flexibility of operating them while reducing energy consumption and access delay.

DETAILED DESCRIPTION

1) Introduction

Content Addressable Memory (CAM) plays an important role in computer architecture. That role could have been even more significant had it not been for the CAM's major disadvantage when compared to RAM: conventional CMOS CAM is highly, and even prohibitively, power-hungry.

We describe a different approach for the rehabilitation of CAM: a Resistive Address Decoder. Consider a typical NAND address decoder as shown on FIGS. 1A-B, where the address of a memory row is hardwired by connecting either address bitline or inverse bitline to the gate of a NMOS transistor as shown on FIG. 1B. In a row where the address matches the hardwired pattern, all NMOS transistors "open" and the row is selected. We suggest adding two resistive elements, such as STT-MRAM or memristive devices, to each NMOS transistor in a voltage dividing manner (FIGS. 2A-D), achieving a two-fold effect: the address pattern in each row becomes programmable rather than hardwired, and the resistive element pair forms a XOR gate, allowing comparison of the input address bit to the bit "programmed" into the resistive elements. These effects enable content addressability, effectively turning an address decoder into a CAM.

In this work, we present the Resistive Address Decoder. Since it offers read latency and energy consumption very similar to those of a hardwired address decoder, it allows creating fully-associative memory structures at the similar price to one-way associative or direct mapped caches.

Three Resistive Address Decoder applications are presented. A fully associative TLB can be implemented at the same silicon area, read delay and energy consumption as a one-way associative TLB. Likewise, a fully associative cache can be implemented incurring the same area, read delay and energy as a direct mapped cache. Physical addresses may be replaced by virtual addresses in various parts of computer architecture, including memory hierarchies.

The rest of this description is organized as follows. Section 2 explores the Resistive Address Decoder, Section 3 discusses its potential applications, and Section 4 offers conclusions.

2) Resistive Address Decoder

Figure 1A:
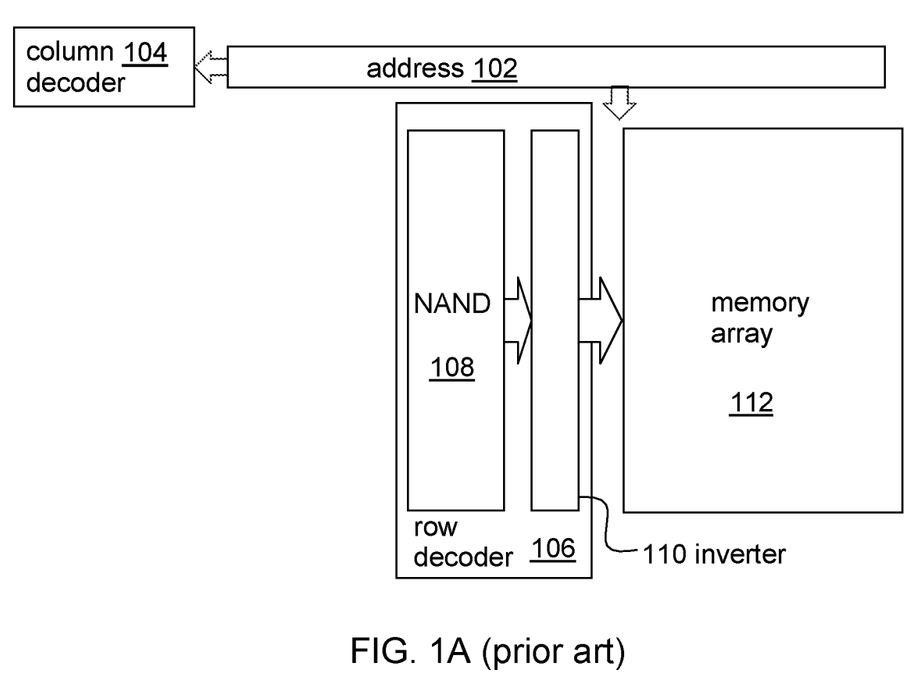
FIGS. 1A-B show a conventional memory architecture.
Figure 1B:
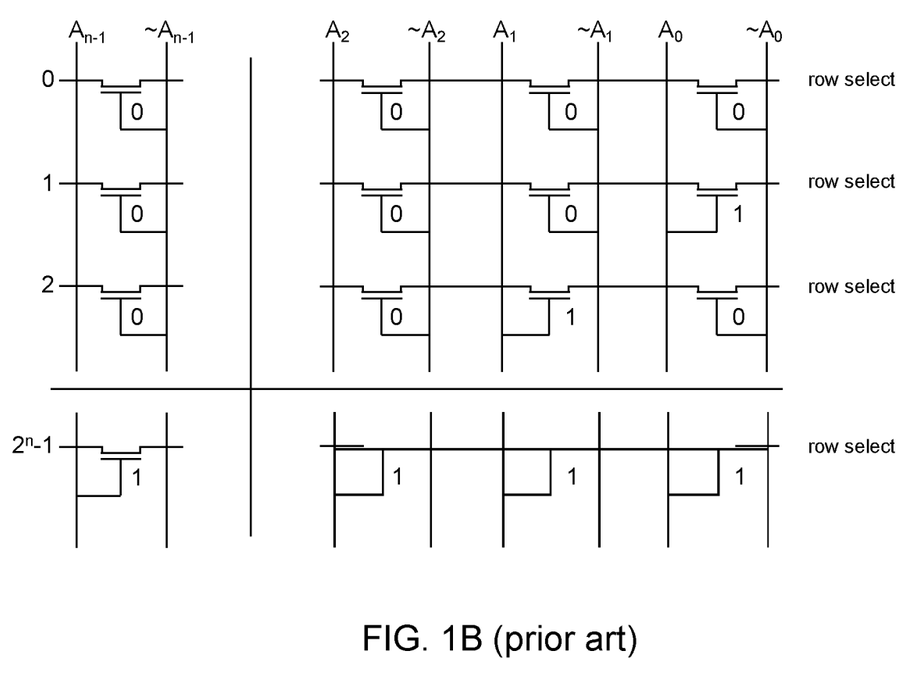

A conventional address decoder is depicted in FIGS. 1A-B. FIG. 1A schematically shows address 102 being processed by column decoder 104 and row decoder 106. Row decoder 106 includes NAND array 108 and an inverter 110, which provides the decoded address to memory array 112. FIG. 1B is a detail view of NAND array 108 in the address decoder of FIG. 1A. Typically, address decoding is decomposed into column selection and row decoding; we focus on the latter, being more area- and time-critical. Row decoder 106 is mainly a NAND decoder 108 as conceptually shown in FIG. 1B. The address bits are hardwired per each word line, as shown on FIG. 1B. The timing of dynamic NAND decoder is defined by the signal propagation time through the series of NMOS devices. Actual NAND decoder design may differ from that concept. For example, it can be implemented by a cascade of NAND segments of three transistors each. During address lookup, such NAND segments are activated sequentially, one after another. Such implementation might be slower but more energy efficient, since in every step, only segments that are selected in the previous step are activated.

While NAND decoders are typically used in non-volatile memory designs, other types of address decoding schemes can be implemented in other RAM designs. For example, address decoders of high-speed on-chip SRAMs are often implemented using random CMOS logic.

The Resistive Address Decoder employs resistive programmable devices rather than the hardwired NMOS transistors (FIGS. 2A-D). The resistive elements are used to program every address bit in every row of the decoder, as well as form XOR gates to allow content addressable search.

A similar approach can be applied to an address decoder implemented using CMOS logic gates.

2.1) Functionality

Resistive elements are two-terminal devices; their resistance changes by changing the direction of the current through them. That resistance is bounded by a minimum resistance $R_{ON}$ (low resistive state, logic '1') and a maximum resistance $R_{OFF}$ (high resistive state, logic '0').

While a variety of resistive elements exist, one that seems well suited for the Address Decoder Design is a ReRAM element, or memristor. It has on/off ratio of $10^{11}$, endurance of $10^{12}$ and switching speed of 100 ps.

Figure 2A:
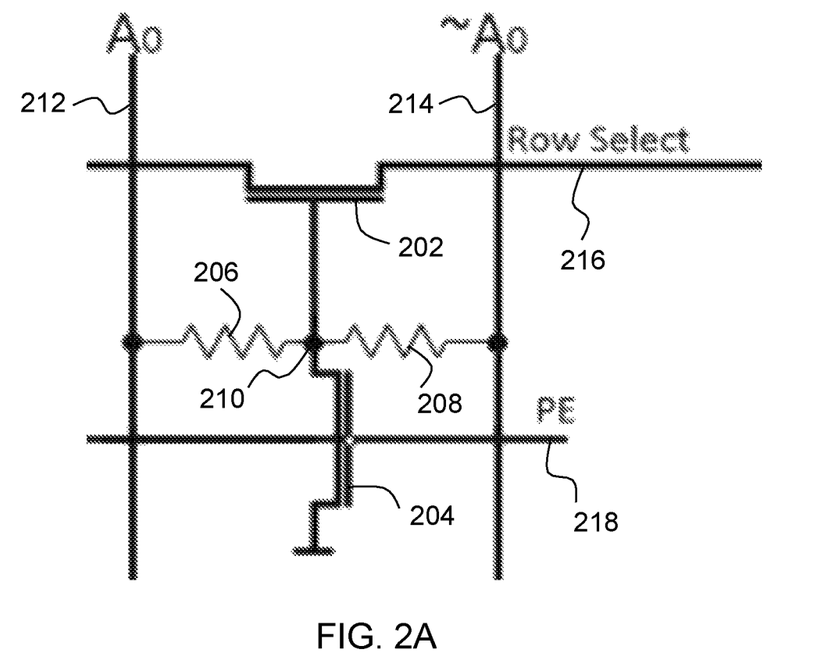
FIGS. 2A-B show memory cells according to embodiments of the invention.

An exemplary cell for the Resistive Address Decoder is shown on FIG. 2A. Here 202 is a row select transistor having a row select gate and 204 is a program enable transistor having an output connected to the row select gate. Programmable resistive elements 206 and 208 are connected in series between complementary address lines 212 and 214, and an intermediate node 210 of the two programmable resistive elements is connected to the row select gate. Here 216 is a row select line and 218 is a program enable (PE) line whose functions are both described below.

Figure 2B:
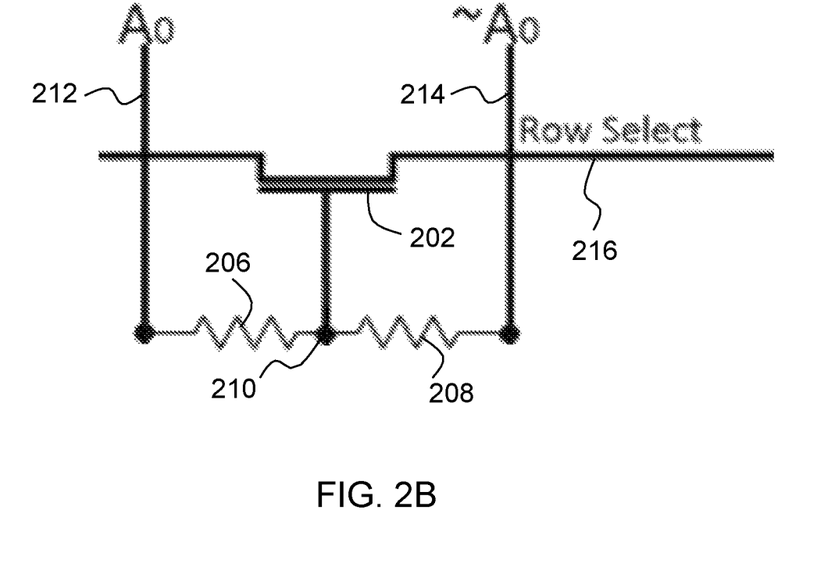

The cell of FIG. 2B is similar to the cell of FIG. 2A except that the program enable transistor is omitted. In these examples, address lines 212 and 214 can also be referred to as bit lines, and an alternative name for the row select lines is word lines.

Figure 2C:
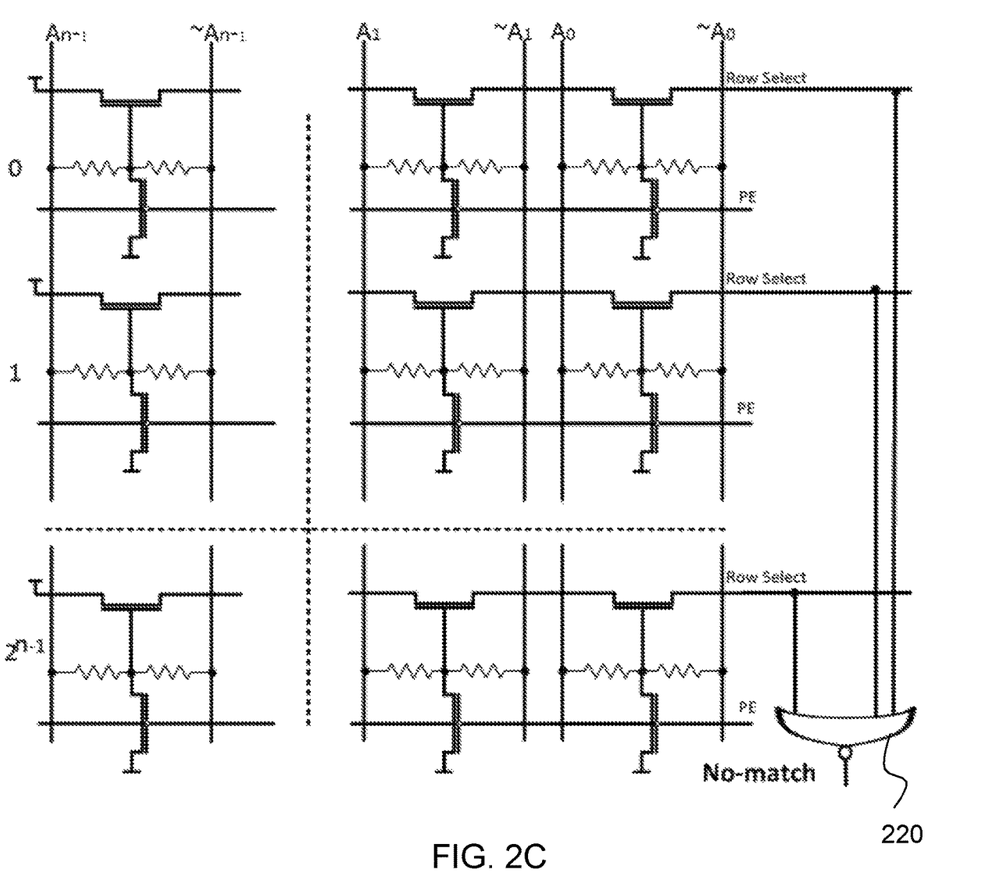
FIGS. 2C-D show memory arrays using the cells of FIGS. 2A-B.
Figure 2D:
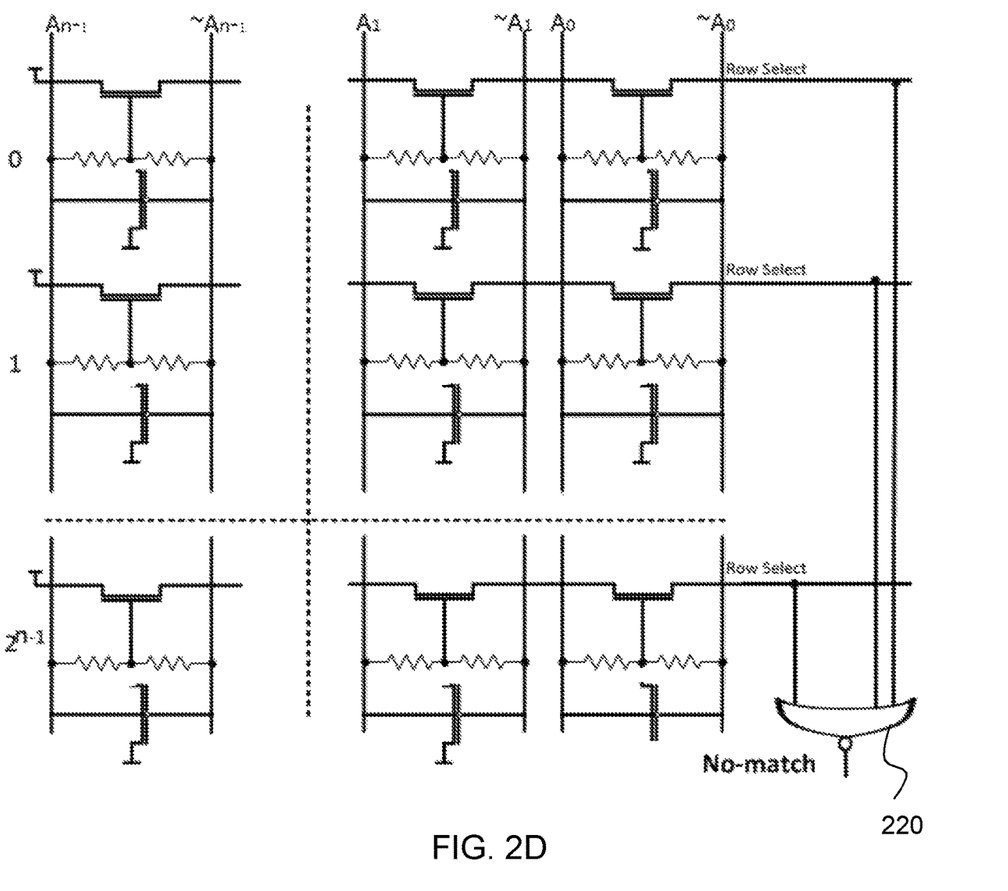

FIG. 2C shows an array of the cells of FIG. 2A. Similarly, FIG. 2D shows an array of the cells of FIG. 2B. Here 220 is an OR gate whose output indicates if no match of an input bit pattern has been found in memory contents, as described below.

The programmable Resistive Address Decoder is shown in FIG. 2C. The hard-wired connections of FIG. 1B are replaced by two resistive elements connected to the gate of each NMOS transistor. One of the resistive elements should be programmed to $R_{ON}$ while the second (complementary) element should be programmed to $R_{OFF}$. If the element connected to the bit-line is $R_{ON}$ (and the other one is $R_{OFF}$), the gate is controlled by the bit-line ('1' at the bit-line enables the transistor). Alternatively, if the other element is $R_{ON}$, the gate is controlled by the inverse bit-line. The former case is considered as address bit '1', and the latter case is address bit '0'.

To program (write) the decoder, the PE (Program Enable) line is enabled, connecting all mid-points to ground. Appropriate (positive or negative) voltage levels applied to the bit lines (and inverse bit lines) induce programming currents through the resistive elements and achieve parallel programming of all resistive elements in a row.

Write operation of each row requires two phases. In one phase, appropriate voltage levels are applied only to bit-lines, and all inverse bit lines are kept disconnected, to assure that only the enabled row is affected. In the second phase, voltage levels are applied only to the inverse bit-lines, while all bit-lines are kept disconnected. To enable the ternary implementation, the "don't care" state can be encoded by programming both resistive elements to $R_{OFF}$.

During read operation, only the row where all address bits match the address pattern placed on bit- and inverse bit-lines are enabled, and select the corresponding memory rows. Clearly, at most one row should be programmed with a given address. If no matching address is found, a "no match" is signaled (generated by wired-ORing of all address rows). Such a "no match" signal can be used to generate page faults.

This read operation is functionally identical to a search in Content Addressable Memory (CAM). In other words, the programmable Resistive Address Decoder functions as CAM, allowing content addressing, and in this case the content is the address.

With the Resistive Address Decoder, memory addresses no longer need to be consecutive, unlike hardwired address decoders. Data can be written anywhere in the memory array. Additionally, the size of the address space becomes arbitrary rather than 2n.

These considerations can be summarized by regarding the example of FIG. 2C as showing a 2-D array of the address decoder cells of FIG. 2A having rows with connected row select transistors and having columns with connected address lines. Here each row has a corresponding program enable line connected to gates of the program enable transistors of that row. The array is configured to program addresses one row at a time by turning on the program enable transistors of a row being programmed and providing address programming currents to the address lines. The array is configured to look up addresses in the address decoder by providing an address pattern to the address lines and determining if any of the rows has all its row select transistors turned on. Although the preceding description refers to an "address decoder" this same configuration can function as a general purpose content-addressable memory, as indicated above. The example of FIG. 2D is similar to the example of FIG. 2C, except that the program enable transistors and program enable lines are omitted, as could be appropriate for a content addressable memory that is programmable some other way, or which only needs to be programmed once and is subsequently a read-only device.

A number of NOR based resistive CAM and ternary CAM designs have been proposed in recent years. In NOR CAM, the match discharges on a mismatch. Since in an address decoder, all rows, but one, mismatch during a read/lookup, the energy consumption is significant. On the contrary, in NAND Resistive CAM, introduced in the present work, the mismatching rows do not conduct current. Therefore, the energy consumption during read is much lower.

A Resistive Address Decoder using memristors has been designed and SPICE-simulated using the TEAM (Threshold adaptive memristor) model, obtaining timing and energy figures as follows. Here the parameters used for these simulations are given by: $D=10^{-8}$, $R_{ON}=100\Omega$, $R_{OFF}=10^8\Omega$, $J=1$, $c_{on}=4\times10^{-5}$, $c_{off}=3.5\times10^{-6}$, $i_{on}=10^{-6}$, $i_{off}=-10^{-6}$, $p=2$, $a_{on}=9\times10^{-9}$, $a_{off}=1.2\times10^{-9}$, $k_{on}=-5\times10^3$, $k_{off}=8\times10^3$, $b=0.0005$, and $w_c=107\times10^{-12}$.

2.2) Timing

Read timing of the Resistive Address Decoder is similar to read timing of hardwired address decoders. A short time is added for signal propagation through the resistive element, as compared with propagation over wire.

Memory write is preceded by the address lookup. If the address exists (programmed into the address decoder), the data is written into that memory row. Otherwise, the new address is programmed into an available empty row of the address decoder, simultaneously with writing the data in the same row of the memory array, to reduce the write latency. For a 512-row memristive NAND address decoder, programming delay is 2 ns. This could substantially increase the write latency relative to hardwired address-decoded memory. However, such increased write latency could be mitigated by dividing the memory into separate modules. If a write is followed by a read but they address different modules, then read and write can be executed in parallel. Another mechanism of the write latency mitigation is a write buffer. It uses a simple queuing mechanism to write data to memory during its free cycles. If a read comes before the data is written in memory, it is read from the write buffer instead.

Furthermore, as shown in Section 3 below, for most potential applications of the Resistive Address Decoder, writes are quite infrequent compared to reads.

2.3) Area

The bit-cell of the Resistive Address Decoder is two resistive elements and two transistors (FIG. 2A) whereas the bit-cell of a hardwired NAND decoder is one transistor. Memristors have reciprocal density of less than $4F^2$, while SRAM memory cells are typically larger than $140F^2$. Resistive elements can at least partly be placed above CMOS logic. Hence, although the programmable address decoder cell is somewhat larger than the hardwired address decoder cell, it may remain small enough to fit within the pitch of the memory array.

2.4) Energy Consumption

Read dynamic energy consumption remains virtually identical to that of a hardwired address decoder.

Write dynamic energy may also include the resistive element programming energy, which may reach 1 pJ for memristors. Static power is consumed by current leaking through the resistive element pair. $R_{OFF}$ spans a $10^4$-$10^{11}\Omega$ range, depending on specific resistive devices and material. Since typically only one memory module is active at a time, the static power consumption could range from 10 nW to 100 mW.

2.5) Endurance

Endurance (namely the number of times the resistive element may be programmed until it stops functioning correctly) could limit the usage of the programmable Resistive Address Decoder. While endurance of STT-MRAM is close to that of DRAM, the endurance of memristors is probably limited to $10^{12}$. To mitigate such endurance, the frequency of write to each memory cell must be lower.

The probability of a write to a certain memory address equals the probability of a memory write times the probability of specific entry to be selected (which in the case of uniform memory utilization equals 1/number_of_entries). Given the typical size of L2 TLB or L2/L3 cache and typical write frequency in such devices, such probability can be quite low: For a memory structure with the resistive address decoder (with endurance of $10^{12}$) to perform for 10 years at 1 GHz, the average frequency of write to each address should be ~1/315,000 cycles$^{-1}$, so as not to exceed $10^{12}$ writes. For a 4 MB L2 cache with the line size of 64 B and 4 MB/64 B=8192 entries (yielding the probability of a certain address entry selection of 1/8192), assuming the fraction of memory access instructions is 20% and L1 miss rate is 10% (yielding the L2 write probability of 1/200), this condition is safely met: $1/200 \times 1/8192 < 1/315000$.

If a memory structure has only few entries, or few tens of entries (for example some L1 DTLBs, or L2 DTLBs with 1G page size), contemporary memristor (with $10^{12}$ endurance) is not a suitable building block. Such small memory structures, however, are set to benefit very little from the resistive address decoder anyway, since making them fully associative using conventional approach (comparators) is quite cost effective.

3) Applications of the Resistive Address Decoder

In this section, we suggest three potential applications of the Resistive Address Decoder.

3.1) Translation Lookaside Buffer (TLB)

The hit ratio of TLB is important since L2 TLB miss may result in a costly page walk. The obvious way of improving the hit ratio is increasing the associativity of the TLB. However, associativity incurs larger silicon area, higher complexity, longer access delay and higher energy consumption.

The TLB CMOS CAM of an associative TLB can be replaced with a programmable Resistive Address Decoder, which provides an "affordable" full associativity, as follows.

Read access delay of a fully associative TLB using Resistive Address Decoder is similar to that of a 1-way associative TLB, which is shorter than the access delay of 4-way or 8-way associative CMOS TLB.

Read energy consumption of a fully associative TLB using Resistive Address Decoder is also similar to that of a 1-way associative TLB.

Writing energy of the Resistive Address Decoder is higher than that of the hardwired TLB due to the need to program resistive elements. However, low write frequency in TLBs, around 1000 or fewer writes per million instructions, is typical for many workloads. In that case, the added energy required for programming the resistive devices may be negligible.

In summary, the Resistive Address Decoder converts a 1-way associative TLB into a fully associative TLB, improving hit ratio and reducing or eliminating page walks. The read latency and energy of such fully associative TLB are very similar to those of 1-way associative TLB. The write energy of such TLB are higher, however since write is typically infrequent in TLBs, the impact on overall energy consumption may be minor.

3.2) Cache Memory

A fully associative cache generally delivers higher hit ratio that a direct mapped one. The Resistive Address Decoder enables a fully associative cache with similar lookup time and energy as a direct mapped cache that uses a hard-wired address decoder. The silicon cost of a fully associative cache using the Resistive Address Decoder is likely to be similar to that of a direct mapped cache, since resistive elements can be placed above CMOS.

Caches are usually too large to be designed as a single memory array. They are typically partitioned into a number of separate memory banks, with the higher bits of address selecting the bank and the lower bits selecting the memory row within the bank. Each memory bank has its own NAND address decoder. If we make programmable only the NAND address decoder inside the memory bank, we create a many-way set associative cache, where each memory row of a memory bank is a way, and each memory bank is a set. This many-way set associative cache architecture is presented in FIG. 3. Here 302 is an index, 304 is index decoder logic, 310 are the memory banks, 314 are the resistive address decoders, and 312 are the memory arrays being addressed. A large number of ways is possible, e.g., 256 or 512. The hit ratio of such many-way set associative cache is likely to be similar to that of a fully associative cache.

Figure 3:
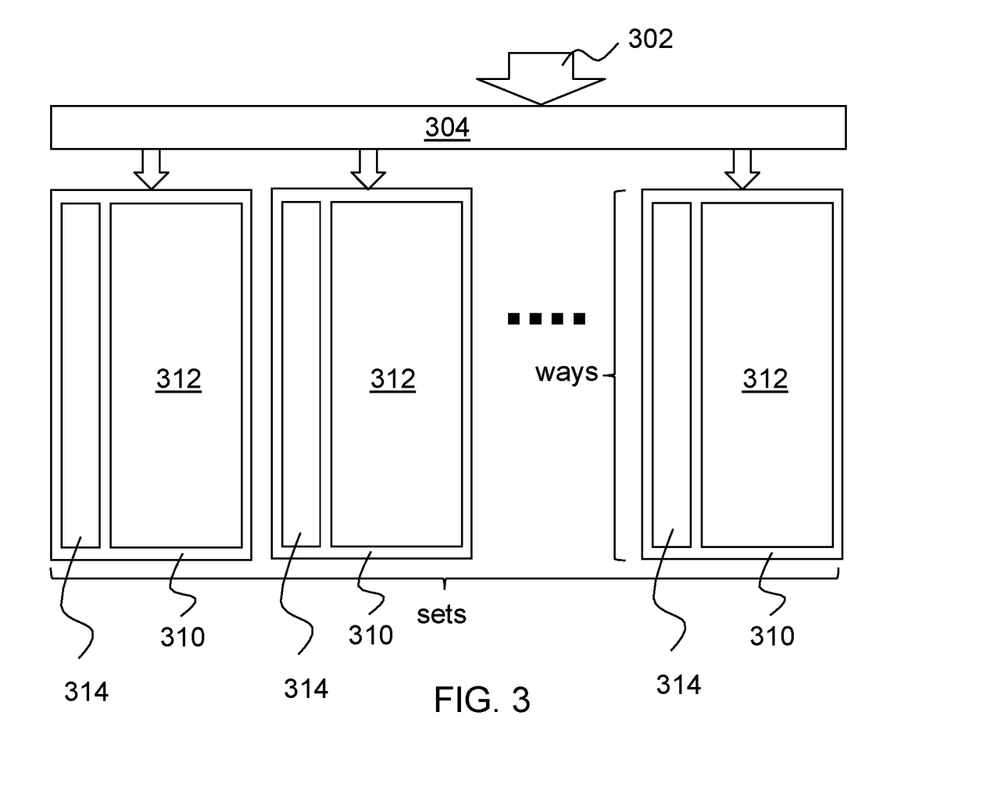
FIG. 3 shows an exemplary architecture of a many-way set associative cache according to principles of the invention.

Read (lookup) timing and energy are similar to those of a direct mapped cache. The only difference is due to the discrepancy in the number of index bits in a direct mapped cache vs. the number of tag bits in the many-way set associative cache, which affects the number of NMOS transistors in, and hence the propagation delay of, the NAND decoder.

Cache replacement could be somewhat costly energy-wise, since per-cell programming energy of a resistive element could reach 1 pJ.

In summary, the Resistive Address Decoder converts a direct mapped cache into a fully associative one. The lookup latency and energy of such fully associative cache are similar to those of a direct mapped cache. The write energy of such a cache is higher. However, as we move farther in the cache hierarchy, the miss rate drops, and with it drops the frequency of write. Therefore, the impact of programming the resistive elements at each write on the overall energy consumption should not be critical, especially in higher level caches.

3.3) Elimination of Physical Addresses

Virtual addressing is essential to contemporary computers. Unfortunately, virtual to physical address translation takes its toll in terms of performance degradation and excessive energy consumption. TLBs alone may consume up to 13% of a core power.

Introducing the Resistive Address Decoder to the main memory may enable the elimination of physical addressing altogether. In a write access, the virtual addresses, together with the corresponding process and thread IDs are transferred to the memory along with the data and are programmed into the Resistive Address Decoder. The delay and energy impact of programming resistive elements can be mitigated by lower write frequency (which could be the case if most memory accesses hit in cache and there is no write-through).

Data is read using the virtual rather than physical address (which no longer exists). Although functionally equivalent to a search in content addressable memory, the read is very similar in terms of access delay and energy consumption to a read from a hardwired address-decoded memory.

If an address that is not programmed in the Resistive Address Decoder is accessed, the "no match" signal is generated, signaling a page fault to the operating system.

Managing memory footprints larger than physical memory also becomes easier. Every newly assigned address is simply programmed into an empty location (which could be marked by a "busy bit"). On page fault, one page is evicted by the OS, the requested page is loaded in its place, and the virtual address in the Decoder is updated.

4) Conclusions

A Resistive Address Decoder has been presented, where the row address pattern is programmed by resistive elements rather than hard-wired. The Resistive Address Decoder allows comparing the input address with the programmed row pattern, effectively turning the address decoder into a CAM.

The read latency and energy consumption of the Resistive Address Decoder are similar to those of a hardwired decoder. Similarly, its silicon area may be only slightly larger because resistive elements can be placed above CMOS transistors. Thus, the Resistive Address Decoder enables creating fully associative memory structures at the price of direct mapped ones.

We discuss potential applications of the Resistive Address Decoder. One such application is a fully associative TLB at similar silicon area, read delay and energy consumption as with a one-way associative TLB. Another application is a many-way associative cache at the same price as a direct mapped cache. Introducing the resistive decoder to main memory may potentially eliminate physical addressing throughout the entire computer architecture, including the memory hierarchies.

The invention claimed is:

1. An address decoder cell comprising:
a row select transistor having a row select gate;
a program enable transistor having an output connected to the row select gate; and
two programmable resistive elements connected in series between complementary address lines;
wherein an intermediate node of the two programmable resistive elements is connected to the row select gate; and
wherein said two programmable resistive elements form a XOR gate.

2. An address decoder comprising:
a 2-D array of the address decoder cells of claim 1 having rows with connected row select transistors and having columns with connected address lines;
wherein each row has a corresponding program enable line connected to gates of the program enable transistors of that row;
wherein the array is configured to program addresses one row at a time by turning on the program enable transistors of a row being programmed and providing address programming currents to the address lines; and
wherein the array is configured to look up addresses in the address decoder by providing an address pattern to the address lines and determining if any of the rows has all its row select transistors turned on.

3. A NAND content addressable memory (CAM) cell comprising:
a row select transistor having a row select gate; and
two programmable resistive elements connected in series between complementary bit lines;
wherein an intermediate node of the two programmable resistive elements is connected to the row select gate; and
wherein said two programmable resistive elements form a XOR gate.

4. A NAND content addressable memory comprising:
a 2-D array of the NAND CAM cells of claim 3 having rows with connected row select transistors and having columns with connected bit lines;
wherein the array is configured to look up content in the NAND content addressable memory by providing an input pattern to the bit lines and determining if any of the rows has all its row select transistors turned on.

5. The NAND CAM cell of claim 3 further comprising a program enable transistor having an output connected to the row select gate.

6. A NAND content addressable memory comprising:
a 2-D array of the NAND CAM cells of claim 5 having rows with connected row select transistors and having columns with connected bit lines;
wherein each row has a corresponding program enable line connected to gates of the program enable transistors of that row;
wherein the array is configured to program content one row at a time by turning on the program enable transistors of a row being programmed and providing content programming currents to the bit lines; and
wherein the array is configured to look up content in the NAND content addressable memory by providing an input pattern to the bit lines and determining if any of the rows has all its row select transistors turned on.

\* \* \* \* \*